United States Patent
Khwa et al.

(10) Patent No.: US 9,349,443 B2
(45) Date of Patent: May 24, 2016

(54) METHOD AND SYSTEM FOR PROGRAMMING MULTI-LEVEL CELL MEMORY

(71) Applicant: Macronix International Co., Ltd., Hsinchu (TW)

(72) Inventors: Win-San Khwa, Taipei (TW); Chao-I Wu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 123 days.

(21) Appl. No.: 14/210,532

(22) Filed: Mar. 14, 2014

(65) Prior Publication Data

US 2015/0262676 A1    Sep. 17, 2015

(51) Int. Cl.
*G11C 11/56* (2006.01)

(52) U.S. Cl.
CPC ........ *G11C 11/5671* (2013.01); *G11C 11/5628* (2013.01); *G11C 2211/5621* (2013.01)

(58) Field of Classification Search
CPC ...................................................... G11C 11/56
USPC ...................................................... 365/148
See application file for complete search history.

(56) References Cited

U.S. PATENT DOCUMENTS

| | | | | |
|---|---|---|---|---|
| 2007/0002638 A1* | 1/2007 | Ohtake | ............ | G11C 29/50012 365/189.05 |
| 2011/0157973 A1* | 6/2011 | Fujiu | .................. | G11C 16/0483 365/185.02 |
| 2013/0077409 A1* | 3/2013 | Shiino | ................ | G11C 16/3459 365/185.22 |
| 2013/0083589 A1* | 4/2013 | Or-Bach | .............. | G11C 11/406 365/149 |
| 2014/0211538 A1* | 7/2014 | Lee | ..................... | G11C 16/3454 365/148 |

* cited by examiner

*Primary Examiner* — Min Huang
(74) *Attorney, Agent, or Firm* — McClure, Qualey & Rodack, LLP

(57) ABSTRACT

A method and a system for programming a multi-level cell (MLC) memory are provided. A first count is 1 initially. The method comprises the following steps. A first energy is set. The first energy is applied to alter a resistance of a cell of the MLC memory. The first count is increased by 1 after performing the step of applying the first energy. In the step of setting the first energy, the first energy is $$\frac{\text{a first initial energy}}{\text{a predetermined value}}$$

initially and the first energy is changed by increasing or decreasing $$\frac{\text{the first initial energy}}{\text{the predetermined value}^{\text{the first count}}}.$$

20 Claims, 4 Drawing Sheets

METHOD AND SYSTEM FOR PROGRAMMING MULTI-LEVEL CELL MEMORY

BACKGROUND

1. Technical Field

The disclosure relates in general to a method and a system for programming a memory, and more particularly to a method and a system for programming a multi-level cell (MLC) memory.

2. Description of the Related Art

With the development of memory technology, a multi-level cell (MLC) memory is invented. The MLC memory is a memory capable of storing more than a single bit of information.

For programming the MLC memory to be a particular level, an incremental step pulse programming (ISPP) method is used. By performing the ISPP method, the level of the memory is increased step by step until the threshold voltage reaches a target level. In the ISPP method, partial-erase is impossible and single erasing step will remove all electrons from the floating gate/charge trapping medium. The programming step consumption of the ISPP method is O(N) for a MLC memory having N steps. The time consumption of programming the MLC memory is needed to be improved.

SUMMARY

The disclosure is directed to a method and a system for programming a multi-level cell (MLC) memory. The method and the system use binary decision trees to improve the programming step consumption and allow adjustment for the data retention of the MLC memory.

According to a first aspect of the present disclosure, a method for programming a multi-level cell (MLC) memory is provided. A first count is 1 initially. The method comprises the following steps. A first energy is set. The first energy is applied to alter a resistance of a cell of the MLC memory. The first count is increased by 1 after performing the step of applying the first energy. In the step of setting the first energy, the first energy is $$\frac{\text{a first initial energy}}{\text{a predetermined value}}$$

initially and the first energy is changed by increasing or decreasing $$\frac{\text{the first initial energy}}{\text{the predetermined value}^{\text{the first count}}}.$$

According to a second aspect of the present disclosure, a system for programming a multi-level cell (MLC) memory is provided. The system includes a processing unit, a programming unit and first counter. The processing unit is for setting a first energy. The programming unit is for applying the first energy to alter a resistance of a cell of the MLC memory. The first counter is for storing a first count. The first count is 1 initially and is increased by 1 after the cell of the MLC memory is applied the first energy. The first energy is $$\frac{\text{a first initial energy}}{\text{a predetermined value}}$$

initially and the first energy is changed by increasing or decreasing $$\frac{\text{the first initial energy}}{\text{the predetermined value}^{\text{the first count}}}.$$

The above and other aspects of the disclosure will become better understood with regard to the following detailed description of the non-limiting embodiment(s). The following description is made with reference to the accompanying drawings.

DETAILED DESCRIPTION

Preferred embodiments are disclosed below for elaborating the invention. Binary decision trees are used to improve the programming step and time consumption and allow adjustment for the data retention of a multi-level cell (MLC) memory. The following embodiments are for the purpose of elaboration only, not for limiting the scope of protection of the invention. Besides, secondary elements are omitted in the following embodiments to highlight the technical features of the invention.

Figure 1:
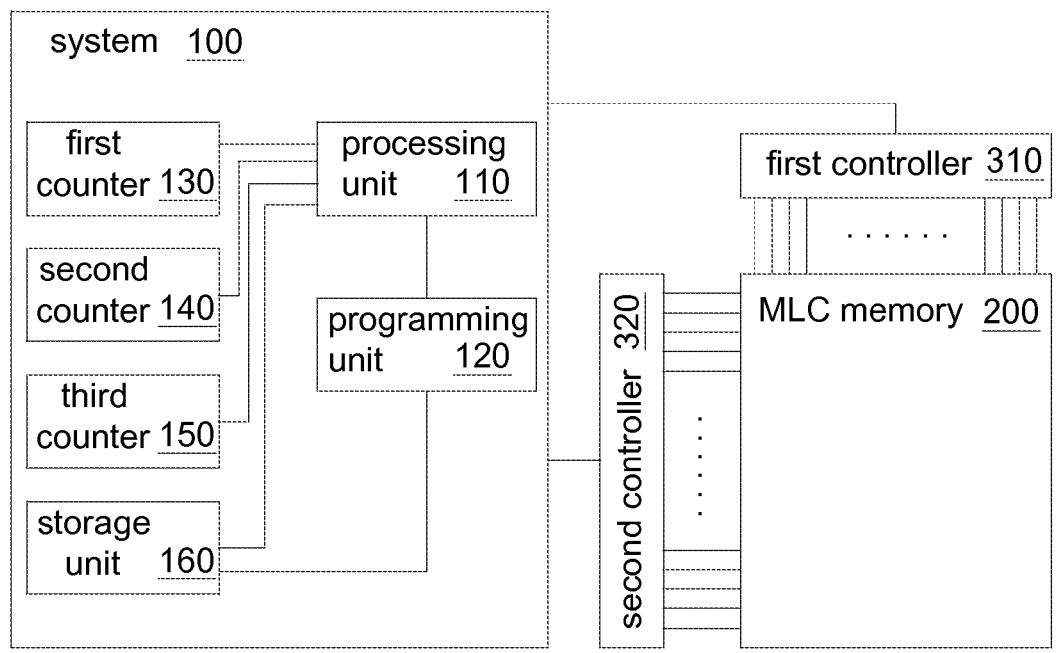
FIG. 1 shows a system for programming a multi-level cell (MLC) memory.

Please referring to FIG. 1, FIG. 1 shows a system 100 for programming a multi-level cell (MLC) memory 200. The system 100 includes a processing unit 110, a programming unit 120, a first counter 130, a second counter 140, a third counter 150 and a storage unit 160.

The processing unit 110 is for performing a plurality of processing procedures and calculating procedures. For example, the processing unit 110 may be a chip, a circuit board, a storage medium storing a plurality of program codes and a circuit having a function for performing the processing procedures and the calculating procedures.

The programming unit 120 is for programming the MLC memory 200 via a first controller 310 and a second controller 320. For example, the programming unit 120 may be a chip, a circuit board, a storage medium storing a plurality of program codes and a circuit having a function for programming the MLC memory 200.

Each of the first counter 130, the second counter 140 and the third counter 150 is for storing and accumulating a counter. For example, the first counter 130, the second counter 140 and the third counter 150 may be a chip, a circuit board, a storage medium storing a plurality of program codes and a circuit having a function for storing and accumulating a counter.

The storage unit 160 is for storing varied data. For example, the storage unit 160 may be a register, a memory or a hard disk.

Figure 2:
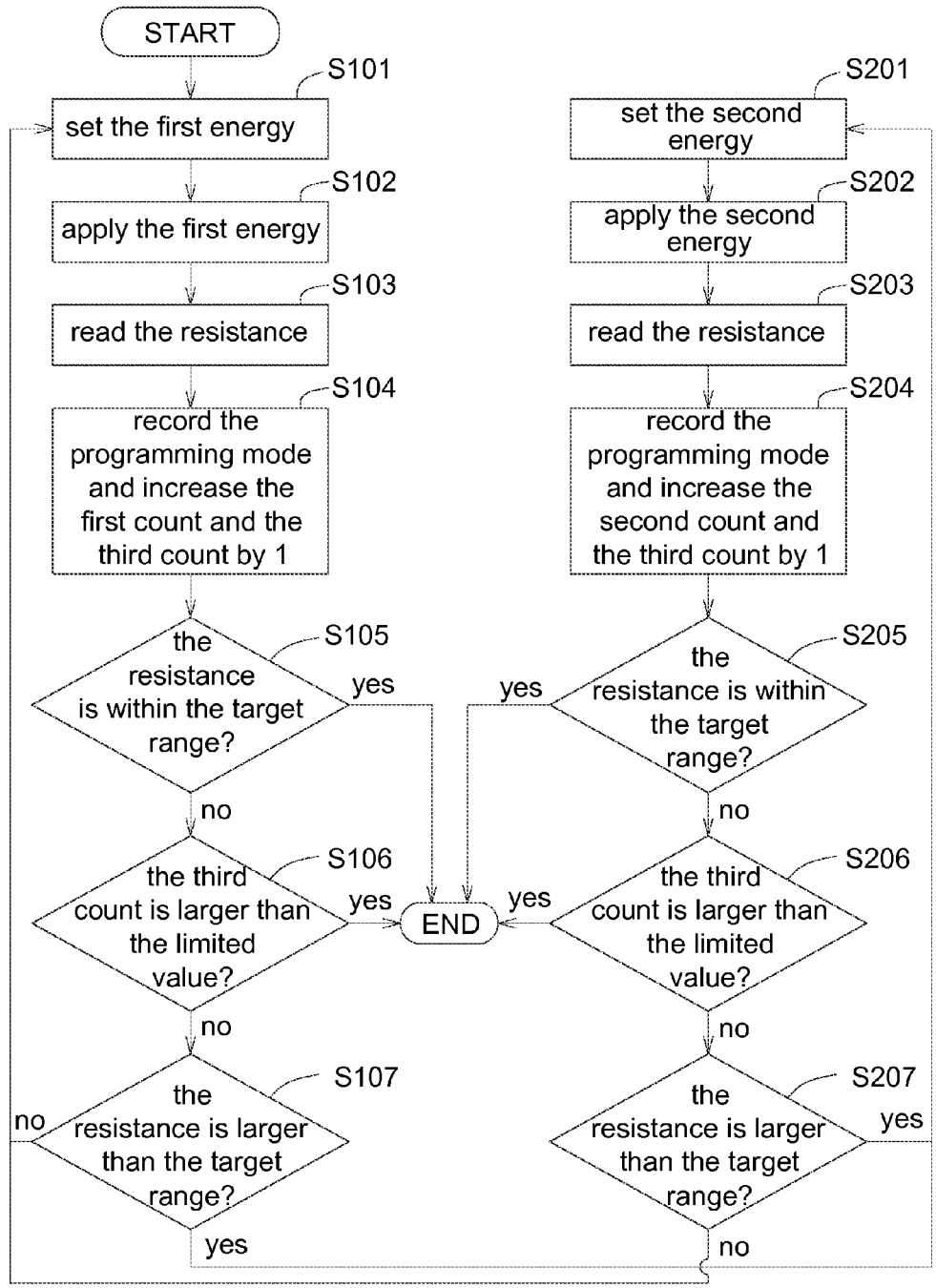
FIG. 2 shows a flow chart of a method for programming the MLC memory.
Figure 3:
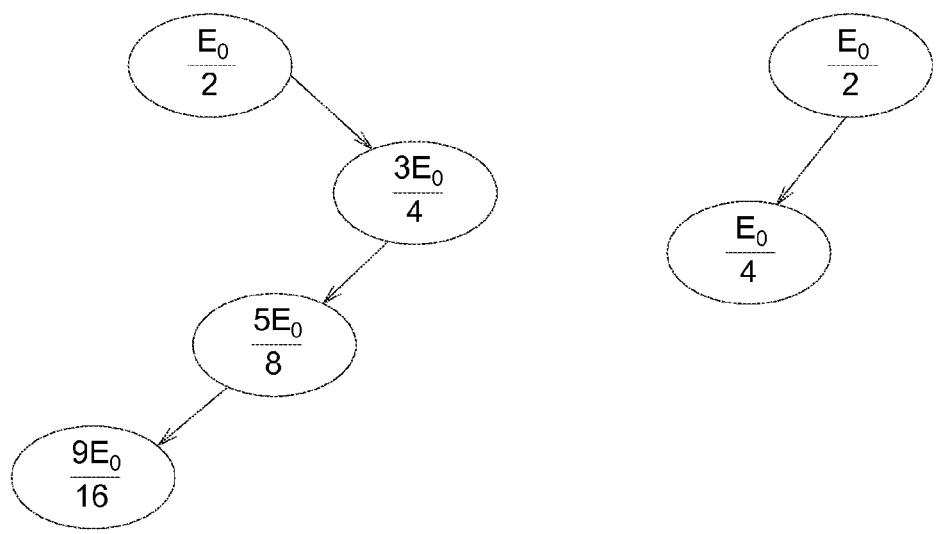
FIG. 3 shows an exemplificative binary decision tree of FIG. 2.
Figure 4:
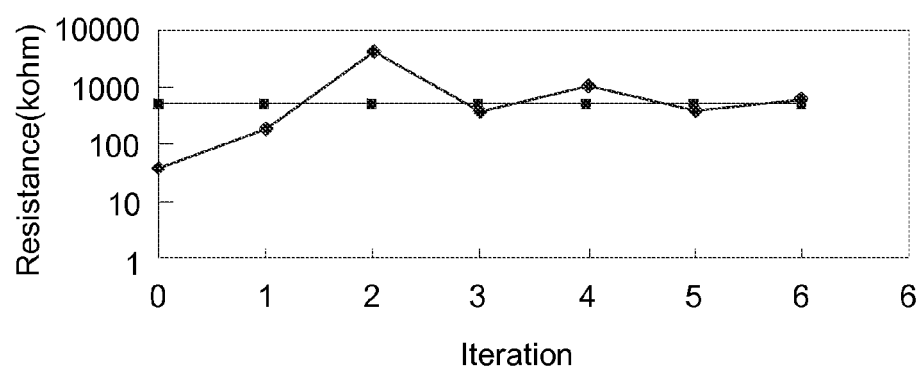
FIG. 4 shows an exemplificative resistance adjusting curve.

Please referring to FIGS. 2 to 4, FIG. 2 shows a flow chart of a method for programming the MLC memory 200, FIG. 3 shows exemplificative binary decision trees of FIG. 2, and FIG. 4 shows an exemplificative resistance adjusting curve. The method uses the binary decision trees to improve the programming step and time consumption and allow adjustment for the data retention of the MLC memory 200. In the present embodiment, steps S101 to S107 are used for performing a reset procedure to raise the resistance of the cell of the MLC memory 200, and steps S201 to S207 are used for performing a set procedure to descend the resistance of the cell of the MLC memory 200. The resistance of the cell of the MLC memory 200 can be raised or descended to converge toward a target range.

Please referring to FIGS. 3 and 4, an example is illustrated. The target range is set to be 450 to 550 kohm. The method is terminated if the resistance of the cell of the MLC memory 200 is within the target rage or the number of the iterations is larger than a limited value, such as 8.

At iteration 1, the cell of the MLC memory 200 is applied a first energy, such as $$\frac{E_0}{2}$$

to perform the reset procedure, and the resistance is raised to be 194.3 kohm which is lower than the target range.

At iteration 2, the cell of the MLC memory 200 is applied the first energy, such as $$\frac{3E_0}{4}\left(=\frac{E_0}{2}+\frac{E_0}{4}\right)$$

to perform the reset procedure, and the resistance is raised to be 4000 kohm which is higher than the target range.

At iteration 3, the cell of the MLC memory 200 is applied a second energy, such as $$\frac{E_0}{2}$$

to perform the set procedure, and the resistance is descended to be 375 kohm which is lower than the target range.

At iteration 4, the cell of the MLC memory 200 is applied the first energy, such as $$\frac{5E_0}{8}\left(=\frac{3E_0}{4}-\frac{E_0}{8}\right)$$

to perform the reset procedure, and the resistance is raised to be 1026 kohm which is higher than the target range.

At iteration 5, the cell of the MLC memory 200 is applied the second energy, such as $$\frac{E_0}{4}\left(=\frac{E_0}{2}-\frac{E_0}{4}\right)$$

to perform the set procedure, and the resistance is descended to be 415 kohm which is lower than the target range.

At iteration 6, the cell of the MLC memory 200 is applied the first energy, such as $$\frac{9E_0}{16}\left(=\frac{5E_0}{8}-\frac{E_0}{16}\right)$$

to perform the reset procedure, and the resistance is raised to be 541 kohm which is within the target range. After the iteration 6, the method is terminated.

Base on above, if the resistance is larger than the target range, then the cell of the MLC memory 200 is applied the second energy to perform the reset procedure at the next iteration; if the resistance is not larger than the target range, then the cell of the MLC memory 200 is applied the first energy to perform the set procedure at the next iteration.

The first energy is $$\frac{E_0}{2}$$

at iteration 1 and changed to be $$\frac{3E_0}{4}$$

by increasing $$\frac{E_0}{4}$$

at iteration 2. Then, the first energy is changed to be $$\frac{5E_0}{8}$$

by decreasing $$\frac{E_0}{8}.$$

Next, the first energy is changed to be $$\frac{9E_0}{16}$$

by decreasing $$\frac{E_0}{16}$$

at iteration 6.

That is to say, the first energy is changed by increasing, if the cell of the MLC memory 200 is previously applied the first energy; the first energy is changed by decreasing, if the cell of the MLC memory 200 is previously applied the second energy. The amount of the change of the first energy is $$\frac{E_0}{2^{first\ count}},$$

wherein the first count is the number of the iterations applying the first energy.

The second energy is $$\frac{E_0}{2}$$

at iteration 3 and changed to be $$\frac{E_0}{4}$$

by decreasing $$\frac{E_0}{4}$$

at iteration 5.

That is to say, the second energy is changed by increasing, if the cell of the MLC memory 200 is previously applied the second energy; the second energy is changed by decreasing, if the cell of the MLC memory 200 is previously applied the first energy. The amount of the change of the second energy is $$\frac{E_0}{2^{second\ count}},$$

wherein the second count is the number of the iterations applying the second energy.

In one embodiment, the initial of the first energy, i.e.

$$\frac{E_0}{2},$$

can be $$\frac{a\ first\ initial\ energy}{a\ predetermined\ value},$$

wherein the first initial energy can be a maximum of the first energy, and the predetermined value can be a real number.

Moreover, the initial of the second energy, i.e. $\frac{E_0}{2}$, can be $$\frac{a\ second\ initial\ energy}{the\ predetermined\ value},$$

wherein the second initial energy can be a maximum of the second energy, and the predetermined value can be a real number. The first initial energy can be identical to or different from the second initial energy.

The method for programming the MLC memory 200 is illustrated by the flowchart of FIG. 2. At beginning, the first count stored in the first counter 130, the second count stored in the second counter 140 and the third counter stored in the third counter 150 are 1 initially.

In step S101, the first energy is set by the processing unit 110. The first energy can be measured according to a current amplitude, a current pulse width, a voltage amplitude or a voltage pulse width. The first energy is $$\frac{the\ first\ initial\ energy}{the\ predetermined\ value}$$

initially.

Next, in step S102, the first energy is applied to raise the resistance of the cell of the MLC memory 200 by the programming unit 120.

Then, in step S103, the resistance of the cell of the MLC memory 200 is read by the processing unit 110.

Afterwards, in step S104, a programming mode is recorded in the storage unit 160 for indicating that the cell of the MLC memory 200 is previously applied the first energy or the second energy. The first counter 130 and third counter 150 respectively increase the first count and the third count by 1 after performing the step S102.

Next, in step S105, whether the resistance of the cell of the MLC memory 200 is within the target range is determined by the processing unit 110. If the resistance of the cell of the MLC memory 200 is within the target range, then the process terminated; if the resistance of the cell of the MLC memory 200 is within the target range, then the process proceeds to step S106.

Then, in step S106, whether the third count is larger than the limited value is determined by the processing unit 110. If the third count is larger than the limited value, then the process terminates; if the third count is not larger than the limited value, then the process proceeds to step S107.

Afterwards, in step S107, whether the resistance of the cell of the MLC memory 200 is larger than the target range is determined by the processing unit 110. If the resistance of the cell of the MLC memory 200 is larger than the target range, then the process proceeds to step S201 to descend the resistance; if the resistance of the cell of the MLC memory 200 is not larger than the target range, then the process proceeds to step S101 to raise the resistance.

In step S201, the second energy is set by the processing unit 110. The second energy can be measured according to the current amplitude, the current pulse width, the voltage amplitude or the voltage pulse width. The second energy is $$\frac{the\ second\ initial\ energy}{the\ predetermined\ value}$$

initially.

Next, in step S202, the second energy is applied to descend the resistance of the cell of the MLC memory 200 by the programming unit 120.

Then, in step S203, the resistance of the cell of the MLC memory 200 is read by the processing unit 110.

Afterwards, in step S204, the programming mode is recorded in the storage unit 160 for indicating that the cell of the MLC memory 200 is previously applied the first energy or the second energy. The second counter 140 and third counter 150 respectively increase the second count and the third count by 1 after performing the step S202.

Next, in step S205, whether the resistance of the cell of the MLC memory 200 is within the target range is determined by the processing unit 110. If the resistance of the cell of the MLC memory 200 is within the target range, then the process terminated; if the resistance of the cell of the MLC memory 200 is not within the target range, then the process proceeds to step S206.

Then, in step S206, whether the third count is larger than the limited value is determined by the processing unit 110. If the third count is larger than the limited value, then the process terminates; if the third count is not larger than the limited value, then the process proceeds to step S207.

Afterwards, in step S207, whether the resistance of the cell of the MLC memory 200 is larger than the target range is determined by the processing unit 110. If the resistance of the cell of the MLC memory 200 is larger than the target range, then the process proceeds to step S201 to descend the resistance; if the resistance of the cell of the MLC memory 200 is not larger than the target range, then the process proceeds to step S101 to raise the resistance.

In FIG. 2, after performing the step S107 or the step S207, the method may return to step S101. In step S101, the first energy is changed by increasing $$\frac{\text{the first initial energy}}{\text{the predetermined value}^{\text{the first count}}},$$

if the cell of the MLC memory 200 is previously applied the first energy; the first energy is changed by decreasing $$\frac{\text{the first initial energy}}{\text{the predetermined value}^{\text{the first count}}},$$

if the cell of the MLC memory 200 is previously applied the second energy.

In FIG. 2, after performing the step S107 or the step S207, the method may return to step S201. In step S201, the second energy is changed by increasing $$\frac{\text{the second initial energy}}{\text{the predetermined value}^{\text{the first count}}},$$

if the cell of the MLC memory 200 is previously applied the second energy; the second energy is changed by decreasing $$\frac{\text{the second initial energy}}{\text{the predetermined value}^{\text{the first count}}},$$

if the cell of the MLC memory 200 is previously applied the first energy.

Base on this method, for programming the MLC memory 200 having N steps to be a particular level, it is averagely only needed log N number of programming steps. The programming step consumption reduced to be O(log N).

Figure 5:
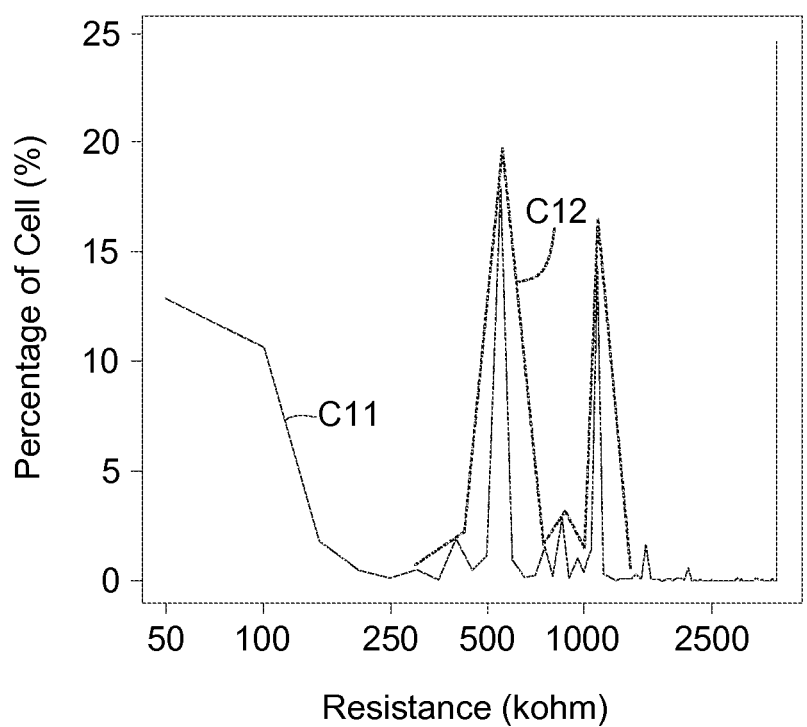
FIG. 5 shows a resistance distribution curve of the MLC memory which is programmed under a condition that the limited value is 8.
Figure 6:
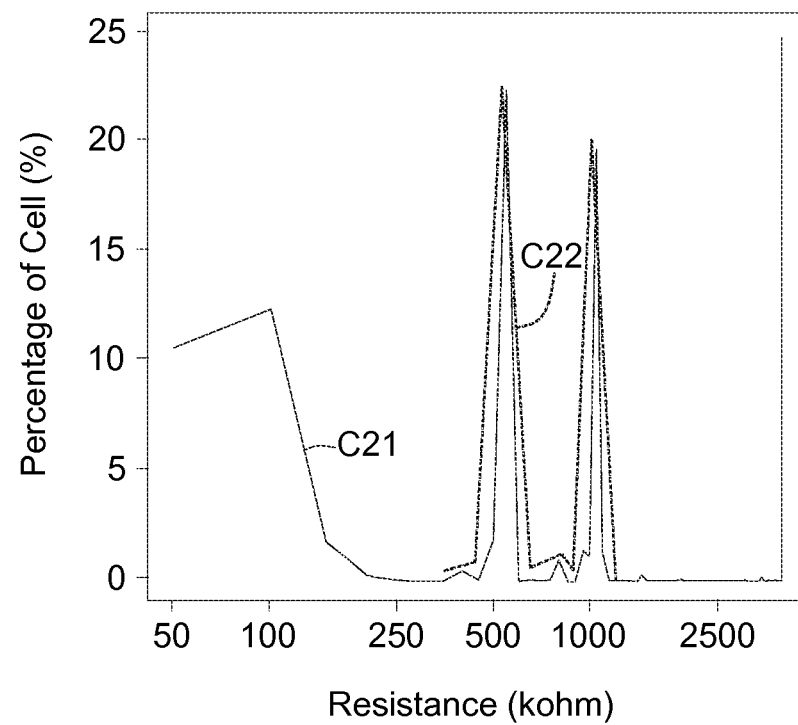
FIG. 6 shows a resistance distribution curve of the MLC memory which is programmed under a condition that the limited value is 12.

Please referring to FIGS. 5 and 6, FIG. 5 shows a resistance distribution curve C11 of the MLC memory 200 which is programmed under a condition that the limited value is 8, and FIG. 6 shows a resistance distribution curve C21 of the MLC memory 200 which is programmed under a condition that the limited value is 12. As time goes by, the resistance distribution curve C11 of FIG. 5 may be shifted to be a resistance distribution curve C12 and the resistance distribution curve C21 of FIG. 6 may be shifted to be the resistance distribution curve C22. The width of each peak of the resistance distribution curve C12 is larger than that of the resistance distribution curve C22. That is to say, the limited value can be used to adjust the resistance distribution to fit flexible data retention requirements.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for programming a multi-level cell (MLC) memory, wherein a first count is 1 initially, and the method comprises:

setting a first energy;

applying the first energy to alter a resistance of a cell of the MLC memory; and increasing the first count by 1 after performing the step of applying the first energy;

wherein in the step of setting the first energy, the first energy is $$\frac{\text{a first initial energy}}{\text{a predetermined value}}$$

initially, the first energy is changed by increasing or decreasing $$\frac{\text{the first initial energy}}{\text{the predetermined value}^{\text{the first count}}},$$

wherein the predetermined value is larger than 1.

2. The method for programming the MLC memory according to claim 1, wherein the predetermined value is 2.

3. The method for programming the MLC memory according to claim 1, wherein a second count is 1 initially, the method further comprises:

setting a second energy;

applying the second energy to alter the resistance of the cell of the MLC memory; and increasing the second count by 1 after performing the step of applying the second energy;

wherein in the step of setting the second energy, the second energy is $$\frac{\text{a second initial energy}}{\text{the predetermined value}}$$

initially, the second energy is changed by increasing or decreasing $$\frac{\text{the second initial energy}}{\text{the predetermined value}^{\text{the second count}}},$$

the step of applying the first energy is used for performing a reset procedure on the cell of the MLC memory, and the step of applying the second energy is used for performing a set procedure on the cell of the MLC memory.

4. The method for programming the MLC memory according to claim 3, wherein the first energy and the second energy are measured according to a current amplitude, a current pulse width, a voltage amplitude or a voltage pulse width.

5. The method for programming the MLC memory according to claim 3, wherein the first initial energy is identical to the second initial energy.

6. The method for programming the MLC memory according to claim 3, wherein the first initial energy is different from the second initial energy.

7. The method for programming the MLC memory according to claim 3, further comprising:
   determining whether the resistance of the cell of the MLC memory is within a target range;
   determining whether the resistance of the cell of the MLC memory is larger than the target range, if the resistance of the cell of the MLC memory is not within the target range;
   wherein if the resistance of the cell of the MLC memory is larger than the target range, then the method proceeds to the step of setting the second energy;
   if the resistance of the cell of the MLC memory is not larger than the target range, then the method proceeds to the step of setting the first energy.

8. The method for programming the MLC memory according to claim 7, wherein in the step of setting the first energy, the first energy is changed by increasing $$\frac{\text{the first initial energy}}{\text{the predetermined value}^{\text{the first count}}},$$

if the cell of the MLC memory is previously applied the first energy; the first energy is changed by decreasing $$\frac{\text{the first initial energy}}{\text{the predetermined value}^{\text{the first count}}},$$

if the cell of the MLC memory is previously applied the second energy.

9. The method for programming the MLC memory according to claim 7, wherein in the step of setting the second energy, the second energy is changed by $$\frac{\text{the second initial energy}}{\text{the predetermined value}^{\text{the second count}}},$$

increasing if the cell of the MLC memory is previously applied the second energy; the first energy is changed by decreasing $$\frac{\text{the second initial energy}}{\text{the predetermined value}^{\text{the second count}}},$$

if the cell of the MLC memory is previously applied the first energy.

10. The method for programming the MLC memory according to claim 7, wherein a third count is 1 initially, and the method further comprises:
   increasing the third count by 1 after performing the step of applying the first energy or performing the step of applying the second energy;
   determining whether the third count is larger than a limited value if the resistance of the cell of the MLC memory is not within the target range;
   wherein the method is terminated if the third count is larger than the limited value.

11. A system for programming a multi-level cell (MLC) memory, comprising:
   a processing unit for setting a first energy;
   a programming unit for applying the first energy to alter a resistance of a cell of the MLC memory; and
   a first counter for storing a first count, the a first count being 1 initially and being increased by 1 after the cell of the MLC memory is applied the first energy;
   wherein the first energy is $$\frac{\text{the first initial energy}}{\text{the predetermined value}}$$

initially, the first energy is changed by increasing or decreasing $$\frac{\text{the first initial energy}}{\text{the predetermined value}^{\text{the first count}}}.$$

wherein the predetermined value is larger than 1.

12. The system for programming the MLC memory according to claim 11, wherein the predetermined value is 2.

13. The system for programming the MLC memory according to claim 11, wherein the processing unit is further for setting a second energy, the programming unit is further for applying the second energy to alter the resistance of the cell of the MLC memory, and the system further comprises:
   a second counter for storing a second count, the second count being 1 initially and being increased by 1 after the cell of the MLC memory is applied the second energy;
   wherein the second energy is $$\frac{\text{the second initial energy}}{\text{the predetermined value}}$$

initially, the second energy is changed by increasing or decreasing $$\frac{\text{the second initial energy}}{\text{the predetermined value}^{\text{the second count}}},$$

the programming unit performs a reset procedure on the cell of the MLC memory by applying the first energy, and the programming unit performs a set procedure on the cell of the MLC memory by applying the second energy.

14. The system for programming the MLC memory according to claim 13, wherein the first energy and the second energy are measured according to a current amplitude, a current pulse width, a voltage amplitude or a voltage pulse width.

15. The system for programming the MLC memory according to claim 13, wherein the first initial energy is identical to the second initial energy.

16. The system for programming the MLC memory according to claim 13, wherein the first initial energy is different from the second initial energy.

17. The system for programming the MLC memory according to claim 13, wherein the processing unit is further for determining whether the resistance of the cell of the MLC memory is within a target range; and the processing unit is further for determining whether the resistance of the cell of the MLC memory is larger than the target range or if the resistance of the cell of the MLC memory is not within the target range;

wherein if the resistance of the cell of the MLC memory is larger than the target range, then the processing unit sets the second energy; if the resistance of the cell of the MLC memory is not larger than the target range, then the processing unit sets the first energy.

18. The system for programming the MLC memory according to claim 17, wherein the first energy is changed by increasing $$\frac{\text{the first initial energy}}{\text{the predetermined value}^{\text{the first count}}},$$

if the cell of the MLC memory is previously applied the first energy; the first energy is changed by decreasing $$\frac{\text{the first initial energy}}{\text{the predetermined value}^{\text{the first count}}},$$

if the cell of the MLC memory is previously applied the second energy.

19. The system for programming the MLC memory according to claim 17, wherein the second energy is changed by increasing $$\frac{\text{the second initial energy}}{\text{the predetermined value}^{\text{the second count}}},$$

if the cell of the MLC memory is previously applied the second energy; the first energy is changed by decreasing $$\frac{\text{the second initial energy}}{\text{the predetermined value}^{\text{the second count}}},$$

if the cell of the MLC memory is previously applied the first energy.

20. The system for programming the MLC memory according to claim 17, further comprising:

a third counter for storing a third count, the third count being 1 initially and being increased by 1 after the cell of the MLC memory is applied the first energy or the second energy;

wherein the processing unit is further for determining whether the third count is larger than a limited value if the resistance of the cell of the MLC memory is not within the target range; the programming unit stops applying the first energy or the second energy if the third count is larger than the limited value.

* * * * *